United States Patent
Ju et al.

(10) Patent No.: US 11,047,924 B2
(45) Date of Patent: Jun. 29, 2021

(54) DETECTION APPARATUS AND METHOD

(71) Applicant: HUAWEI TECHNOLOGIES CO., LTD., Shenzhen (CN)

(72) Inventors: Mingming Ju, Nanjing (CN); Xiaobing Li, Shenzhen (CN); Jianwei Yu, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 110 days.

(21) Appl. No.: 16/382,221

(22) Filed: Apr. 12, 2019

(65) Prior Publication Data
US 2019/0317132 A1 Oct. 17, 2019

(30) Foreign Application Priority Data
Apr. 12, 2018 (CN) .......................... 201810327772.4

(51) Int. Cl.
*G01R 31/58* (2020.01)
*G01R 1/20* (2006.01)
*G06F 13/42* (2006.01)

(52) U.S. Cl.
CPC ............. *G01R 31/58* (2020.01); *G01R 1/203* (2013.01); *G06F 13/4282* (2013.01); *G06F 2213/0002* (2013.01)

(58) Field of Classification Search
CPC ...... G01R 1/203; G01R 31/58; G06F 13/4282
See application file for complete search history.

(56) References Cited

U.S. PATENT DOCUMENTS 5,343,843 A * 9/1994 Hamren ................ F02P 5/1525
                                                      123/406.38
5,381,348 A * 1/1995 Ernst ....................... H04L 43/50
                                                      324/534
(Continued)

FOREIGN PATENT DOCUMENTS

CN    102290982 A    12/2011
CN    104237728 A    12/2014
(Continued)

OTHER PUBLICATIONS

Understanding Common-Mode Signals, Maxim Integrated, Tutorials 2045, Jun. 2003 (Year: 2003).*

*Primary Examiner* — Christopher E Mahoney
(74) *Attorney, Agent, or Firm* — Kilpatrick Townsend & Stockton LLP (57) ABSTRACT

Embodiments of application relate to the field of communications technologies, and in particular, to a detection apparatus and method for quickly locating a wire fault of a serial bus and finding a cause. The apparatus is connected to a serial bus between a primary device and a secondary device, the serial bus includes a first bus and a second bus, and the apparatus includes a voltage divider module, a voltage follower module, a forward bias module, and a control module that are sequentially connected. The voltage divider module is configured to reduce a voltage of the first bus and a voltage of the second bus. The voltage follower module is configured to enhance an electrical signal of the first bus and an electrical signal of the second bus. The forward bias module is configured to forward bias the voltage of the first bus and the voltage of the second bus.

17 Claims, 3 Drawing Sheets

(56) References Cited

U.S. PATENT DOCUMENTS

| | | |
|---|---|---|
| 6,249,127 B1 | 6/2001 | Fluhrer |
| 2011/0291733 A1 | 12/2011 | Yano |
| 2014/0361783 A1 | 12/2014 | Haas |
| 2015/0009598 A1 | 1/2015 | Trombetti |
| 2015/0089259 A1* | 3/2015 | Warren ................ G06F 1/3206 713/322 |
| 2015/0346259 A1 | 12/2015 | Jiang et al. |

FOREIGN PATENT DOCUMENTS

| | | | |
|---|---|---|---|
| CN | 104283583 A | | 1/2015 |
| CN | 105259475 A | | 1/2016 |
| CN | 105676054 A | | 6/2016 |
| CN | 205941756 U | | 2/2017 |
| CN | 206133545 U | | 4/2017 |
| CN | 107659476 A | * | 2/2018 |
| JP | 2011071641 A | | 4/2011 |
| WO | 2018032754 A1 | | 2/2018 |

* cited by examiner

FIG. 1

(Prior Art)

DETECTION APPARATUS AND METHOD

CROSS-REFERENCE TO RELATED APPLICATIONS

This application claims priority to Chinese Patent Application No. 201810327772.4, filed with the Chinese Patent Office on Apr. 12, 2018, and entitled "A DETECTION APPARATUS AND METHOD", which is incorporated herein by reference in its entirety.

TECHNICAL FIELD

Embodiments of this application relate to the field of communications technologies, and in particular, to a detection apparatus and method.

BACKGROUND

Currently, most devices communicate by using serial interfaces (Serial interface, RS). An RS is an interface on which serial communication is used, and common RSs include RS485, RS422, RS232, and the like. During deployment and installation of many RS devices, on-site cabling and wiring are required. Because of relatively-complex on-site construction conditions, excessive cables, same or similar wiring terminals, and the like, problems such as incorrect connection and connection miss of cables unavoidably occur. When finding that some system functions cannot normally run, construction personnel and maintenance personnel may need to check cables one by one. This is time-consuming and laborious and causes low working efficiency.

Figure 1:
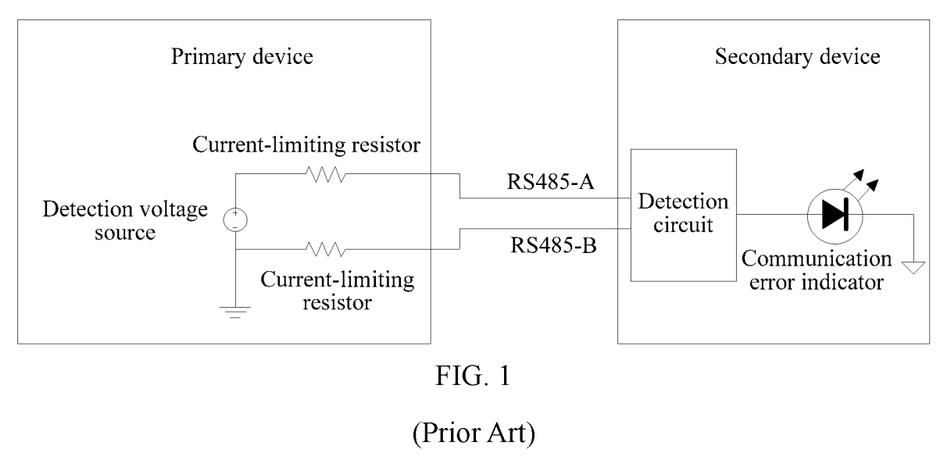
FIG. 1 is a schematic circuit diagram of detecting a state of an RS485 bus.

For an RS485 device, the prior art provides a detection solution. As shown in FIG. 1, in the solution, a state of an RS485 bus between a primary device and a secondary device is detected by using the secondary device. Specifically, differential amplification is performed on a level of the bus and the amplified level is input to a positive input end of a comparator. A negative input end of the comparator is connected to a reference voltage 0.2 V, and an output end of the comparator drives an LED indicator. When a differential level is greater than 0.2 V, the LED indicator is in an off state, and when the differential level is less than 0.2 V, the LED indicator is in an on state. When data is transmitted by using the bus, the level of the RS485 bus constantly changes and a state of the LED indicator constantly changes. If the bus is short-circuited or the secondary device is not connected to the primary device, the LED indicator does not change.

In the method, if a plurality of secondary devices are connected on the RS485 bus, when the positive and the negative of the bus are reversely connected, the LED indicator may also switch between an off state and an on state. In this case, it is incorrectly determined, based on flickering of the LED indicator, that the bus is normal. Actually, the RS485 bus is abnormal and communication cannot be performed. In addition, the method may be used only to determine a cable short circuit and a cable open circuit and cannot be used to determine other types of faults such as incorrect wire connection and cable connection miss.

SUMMARY

Embodiments of this application provide a detection apparatus and method to detect a wire fault of a serial bus and quickly determine and locate the wire fault of the bus.

To achieve the foregoing objective, the following technical solutions are used in the embodiments of this application:

According to a first aspect, a detection apparatus is provided. The apparatus is connected to a serial bus, the serial bus is disposed between a primary device and a secondary device, the serial bus includes a first bus and a second bus, and the apparatus includes a voltage divider module, a voltage follower module, a forward bias module, and a control module that are sequentially connected. The voltage divider module is configured to reduce a voltage of the first bus and a voltage of the second bus. The voltage follower module is configured to enhance an electrical signal of the first bus and an electrical signal of the second bus. The forward bias module is configured to forward bias the voltage of the first bus and the voltage of the second bus. The control module is configured to: measure a digital voltage of the first bus and a digital voltage of the second bus, and determine a wire fault type of the serial bus based on the digital voltage of the first bus, the digital voltage of the second bus, and an electrical standard for the serial bus.

With reference to the first aspect, in a first possible implementation of the first aspect, the first bus is a positive electrode bus, the second bus is a negative electrode bus, and the control module is further configured to: determine a differential digital voltage of the serial bus based on the digital voltage of the first bus and the digital voltage of the second bus; and determine the wire fault type of the serial bus based on the differential digital voltage and the electrical standard for the serial bus.

With reference to the first possible implementation of the first aspect, in a second possible implementation of the first aspect, the first bus is pulled up to a preset voltage, and the second bus is pulled down to a ground cable.

With reference to the first or the second possible implementation of the first aspect, in a third possible implementation of the first aspect, the control module is specifically configured to: when the serial bus is in an idle state, measure the digital voltage of the first bus and the digital voltage of the second bus; when the serial bus outputs a logical high level, measure the digital voltage of the first bus and the digital voltage of the second bus; and when the serial bus outputs a logical low level, measure the digital voltage of the first bus and the digital voltage of the second bus.

With reference to the first aspect, in a fourth possible implementation of the first aspect, the first bus is a receive (RX) bus, the second bus is a transmit (TX) bus, and a ground cable of the primary device is connected to a ground cable of the secondary device.

With reference to the fourth possible implementation of the first aspect, in a fifth possible implementation of the first aspect, the control module is specifically configured to: measure the digital voltage of the first bus; when the second bus outputs a logical high level, measure the digital voltage of the second bus; and when the second bus outputs a logical low level, measure the digital voltage of the second bus.

With reference to any one of the first aspect or the first to the fifth possible implementations of the first aspect, in a sixth possible implementation of the first aspect, the voltage divider module includes two voltage division units, each voltage division unit corresponds to one bus, and the voltage division unit includes a first resistor, a second resistor, and a capacitor, where a first end of the first resistor is connected to the bus, a second end of the first resistor is connected to a first end of the second resistor, a first end of the capacitor, and the voltage follower module, and a second end of the second resistor and a second end of the capacitor are connected to a ground cable.

With reference to any one of the first aspect or the first to the sixth possible implementations of the first aspect, in a seventh possible implementation of the first aspect, the voltage follower module includes two voltage followers, each voltage follower corresponds to one bus, the voltage follower includes a first input end, a second input end, and an output end, and the output end is connected to the second input end and the forward bias module.

With reference to any one of the first aspect or the first to the seventh possible implementations of the first aspect, in an eighth possible implementation of the first aspect, the forward bias module includes two forward bias units, each forward bias unit corresponds to one bus, and the forward bias unit includes a third resistor and a fourth resistor, where a first end of the third resistor is connected to the voltage follower module, a second end of the third resistor is connected to a first end of the fourth resistor and the control module, and a second end of the fourth resistor is connected to a reference voltage.

According to a second aspect, a detection method is provided, applied to a detection apparatus, where the apparatus is connected to a serial bus, the serial bus is disposed between a primary device and a secondary device, the serial bus includes a first bus and a second bus, and the method includes: reducing a voltage of the first bus and a voltage of the second bus; enhancing an electrical signal of the first bus and an electrical signal of the second bus; forward biasing the voltage of the first bus and the voltage of the second bus; and measuring a digital voltage of the first bus and a digital voltage of the second bus, and determining a wire fault type of the serial bus based on the digital voltage of the first bus, the digital voltage of the second bus, and an electrical standard for the serial bus.

With reference to the second aspect, in a first possible implementation of the second aspect, the first bus is a positive electrode bus, the second bus is a negative electrode bus, and the determining a wire fault type of the serial bus based on the digital voltage of the first bus, the digital voltage of the second bus, and an electrical standard for the serial bus includes: determining a differential digital voltage of the serial bus based on the digital voltage of the first bus and the digital voltage of the second bus; and determining the wire fault type of the serial bus based on the differential digital voltage and the electrical standard for the serial bus.

With reference to the first possible implementation of the second aspect, in a second possible implementation of the second aspect, the first bus is pulled up to a preset voltage, and the second bus is pulled down to a ground cable.

With reference to the first or the second possible implementation of the second aspect, in a third possible implementation of the second aspect, the measuring a digital voltage of the first bus and a digital voltage of the second bus includes: when the serial bus is in an idle state, measuring the digital voltage of the first bus and the digital voltage of the second bus; when the serial bus outputs a logical high level, measuring the digital voltage of the first bus and the digital voltage of the second bus; and when the serial bus outputs a logical low level, measuring the digital voltage of the first bus and the digital voltage of the second bus.

With reference to the second aspect, in a fourth possible implementation of the second aspect, the first bus is a receive (RX) bus, the second bus is a transmit (TX) bus, and a ground cable of the primary device is connected to a ground cable of the secondary device.

With reference to the fourth possible implementation of the second aspect, in a fifth possible implementation of the second aspect, the measuring a digital voltage of the first bus and a digital voltage of the second bus includes: measuring the digital voltage of the first bus; when the second bus outputs a logical high level measuring the digital voltage of the second bus; and when the second bus outputs a logical low level, measuring the digital voltage of the second bus.

According to the detection apparatus and method provided in the embodiments of this application, the voltage of the first bus and the voltage of the second bus are reduced, to prevent the detection apparatus from interfering communication using the serial bus. In addition, the electrical signals of the buses are enhanced and the voltages of the buses are forward biased, so that when a digital voltage of the serial bus is measured in different states of the serial bus, measurement accuracy can be ensured. Therefore, when the wire fault type of the serial bus is determined based on the measured digital voltage and the electrical standard for the serial bus, a fault can be quickly located and a cause can be quickly found, thereby improving a detection rate and accuracy.

DESCRIPTION OF EMBODIMENTS

Before embodiments of this application are described, technical terms in the embodiments of this application are first described.

A serial communications device is a device communicating by using a serial interface, and a serial interface may be disposed on a serial communications device. A corresponding serial interface may be connected between devices by using a cable, to implement serial communication between the devices. A serial communications device may be a base station, a micro base station, a power supply monitoring device, a lower-layer sub-device of a power supply monitoring device, a temperature sensor device, or the like. In the embodiments of this application, both a primary device and a secondary device are serial communications devices.

Serial interfaces may include an RS485 interface, an RS422 interface, an RS232 interface, and the like. Differential transmission, also referred to as balanced transmission, is used for a data signal on the RS485 interface, where a twisted pair is used, one cable of the twisted pair is defined as A and the other cable of the twisted pair is defined as B, and data is received and sent by using both of the two cables A and B. The cable A may be referred to as a positive electrode bus, and the cable B may be referred to as a negative electrode bus. The RS485 interface supports halfduplex communication. The RS422 interface supports full duplex communication and can support point-to-multipoint bidirectional communication. A working principle of the RS422 interface is similar to that of the RS485 interface, and a difference lies in that the RS422 interface may include two pairs of interfaces and each pair of interfaces use two signal cables (including a positive electrode bus and a negative electrode bus). To be specific, the RS422 interface uses four signal cables and each pair of signal cables may be used for communication in one direction. Single-ended communication that may also be referred to as unbalanced transmission is used for the RS232 interface. To be specific, data signals of a receive end and a transmit end are relative to a signal ground, the RS232 interface may include a transmit (TX) interface and a receive (RX) interface, the TX interface is responsible for sending data, and the RX interface is responsible for receiving data. Therefore, buses used for the RS232 interface may include a receive bus and a transmit bus.

A wire fault of a serial communications device is a fault generated when the serial communications device cannot perform normal communication because a wire of a serial bus between serial communications devices is erroneous. A serial communications device may have a plurality of types of wire faults. For example, wire fault types may include: a short circuit, an open circuit, a reversed connection, a line order error, cable bonding, improper installation of a cable, connection miss, and the like.

For ease of understanding, the following describes different wire fault types by using an example of a device communicating by using an RS485 bus. In a connection process using the RS485 bus, if a positive electrode bus and a negative electrode bus of the RS485 bus are directly connected, the wire fault type may be referred to as a short circuit; if a positive electrode bus of the RS485 bus is connected to a negative electrode interface and a negative electrode bus is connected to a positive electrode interface, the wire fault type may be referred to as a reversed connection; if the RS485 bus and a non-RS485 cable are abnormally connected, for example, an RS485 bus and a +5 V power supply line are abnormally bonded, the wire fault type may be referred to as cable bonding; and if a corresponding terminal or a corresponding cable is not inserted into an RS485 port, the wire fault type may be referred to as improper installation of a cable. A line order error is a reversed connection for RS485 and may be a line order error of three cables for RS232. For example, an RX bus of a primary device is connected to a ground cable of a secondary device, a TX bus of the primary device is connected to a TX bus of the secondary device, and a ground cable of the primary device is connected to an RX bus of the secondary device.

In the embodiments of this application, an open circuit, connection miss, and improper installation of a cable may be collectively referred to as improper installation of a cable, and a reversed connection of the RS485 bus and a line order error of the RS232 bus may be collectively referred to as a line order error.

Figure 2:
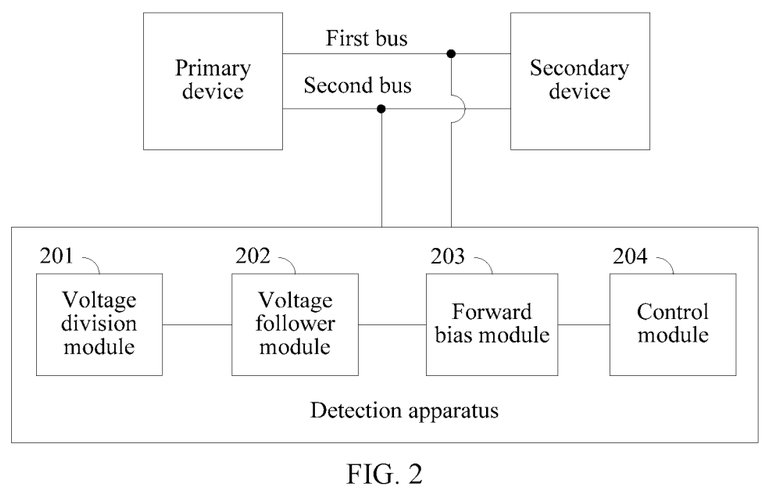
FIG. 2 is a schematic structural diagram of a detection apparatus according to an embodiment of this application.

FIG. 2 is a schematic structural diagram of a detection apparatus according to an embodiment of this application. Referring to FIG. 2, the apparatus is connected to a serial bus, the serial bus is disposed between a primary device and a secondary device, the serial bus includes a first bus and a second bus, and the apparatus includes a voltage divider module 201, a voltage follower module 202, a forward bias module 203, and a control module 204 that are sequentially connected.

The voltage divider module 201 is configured to reduce a voltage of the first bus and a voltage of the second bus.

The serial bus may be an RS485 bus, an RS422 bus, or an RS232 bus. When the serial bus is the RS485 bus, the first bus may be a positive electrode bus or a cable A, and the second bus may be a negative electrode bus or a cable B. When the serial bus is the RS422 bus, the serial bus may include two pairs of buses, each pair of buses may include a first bus and a second bus, the first bus may be a positive electrode bus, and the second bus may be a negative electrode bus. In this embodiment of this application, one pair of buses are used as an example for description. When the serial bus is the RS232 bus, the first bus may be a receive (RX) bus and the second bus may be a transmit (TX) bus, or the first bus may be a TX bus and the second bus may be an RX bus. In this embodiment of this application, an example in which the first bus is an RX bus and the second bus is a TX bus is used for description.

Figure 3:
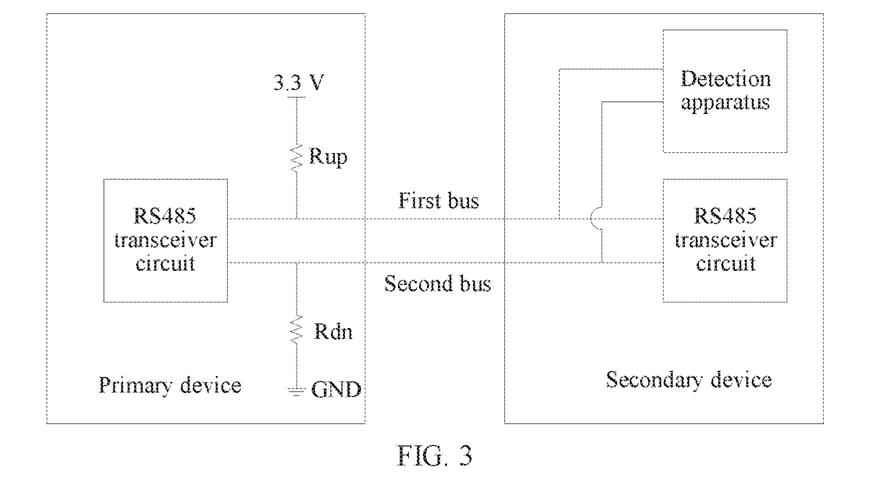
FIG. 3 is a schematic structural diagram of another detection apparatus according to an embodiment of this application.
Figure 4:
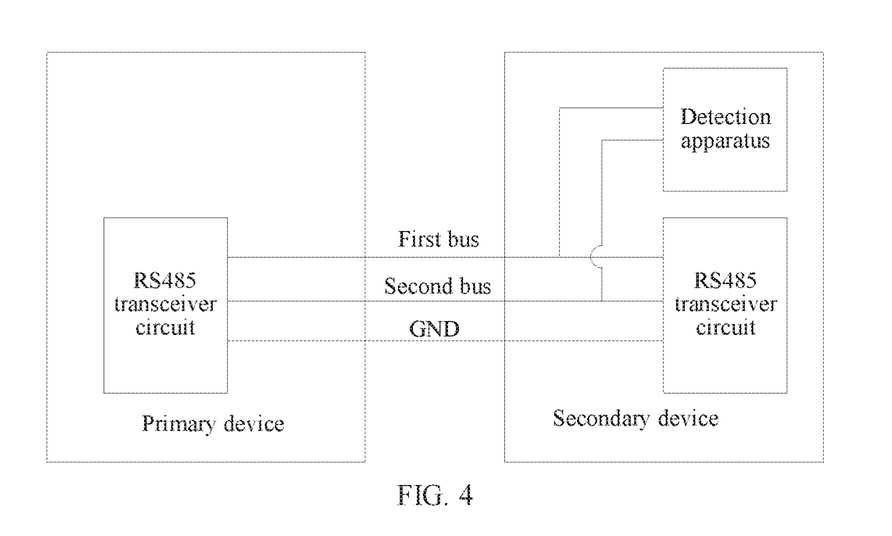
FIG. 4 is a schematic structural diagram of still another detection apparatus according to an embodiment of this application.

In addition, the apparatus may be located in the secondary device or may be located in the primary device. Whether the apparatus is located in the primary device or located in the secondary device, detection principles are similar. In this embodiment of this application, an example in which the apparatus is located in the secondary device is used for description. When the serial bus is the RS485 bus or the RS422 bus, as shown in FIG. 3, on a primary device side, a first bus may be pulled up to a preset voltage (for example, the preset voltage is 3.3 V and the first bus is pulled up to 3.3 V by using a pull-up resistor Rup), and a second bus may be pulled down to a ground cable (for example, the second bus is pulled down to GND by using a pull-down resistor Rdn). A first bus and a second bus on a secondary device side are not processed. This can ensure that a level is forward biased when the serial bus is normally connected and there is no data transmission, and the serial bus is not always in a busy state. When the serial bus is the RS232 bus, serial buses of the primary device and the secondary device may further include a ground cable, and as shown in FIG. 4, the ground cable of the primary device is connected to the ground cable of the secondary device.

Specifically, the apparatus is connected to the first bus and the second bus, and when the apparatus detects the first bus and the second bus, communication using the first bus and the second bus is interfered to some extent. Therefore, to prevent the apparatus from interfering communication using the first bus and the second bus, the voltage divider module 201 may be disposed in the apparatus. The voltage divider module 201 is configured to reduce a voltage of the first bus and a voltage of the second bus. To be specific, the voltage divider module 201 reduces a voltage of an electrical signal received by the apparatus from the serial bus, so that the apparatus is in a high impedance state relative to communication using the serial bus.

Figure 5:
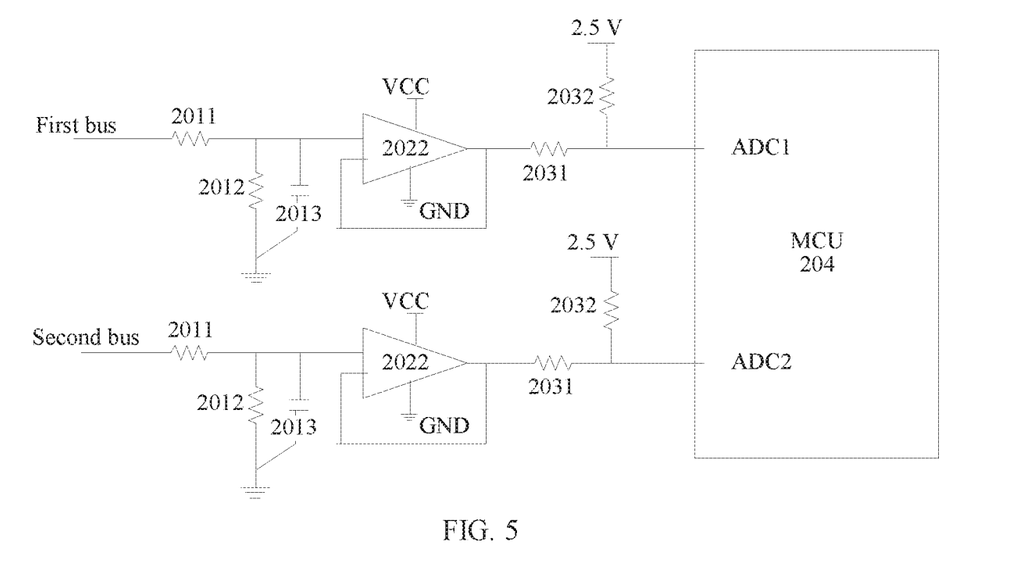
FIG. 5 is a schematic structural diagram of another detection apparatus according to an embodiment of this application.

Optionally, as shown in FIG. 5, the voltage divider module 201 includes two voltage division units, each voltage division unit corresponds to one bus, and each voltage division unit includes a first resistor 2011, a second resistor 2012, and a capacitor 2013. A first end of the first resistor 2011 is connected to the bus, a second end of the first resistor 2011 is connected to a first end of the second resistor 2012, a first end of the capacitor 2013, and the voltage follower module 202, and a second end of the second resistor 2012 and a second end of the capacitor 2013 are connected to a ground cable (GND). Values of the first resistor 2011 and the second resistor 2012 cannot be excessively small, and it needs to be ensured that the apparatus is in a high impedance state relative to communication using the serial bus.

The voltage follower module 202 is configured to enhance an electrical signal of the first bus and an electrical signal of the second bus.

Because the electrical signal of the first bus and the electrical signal of the second bus output by the voltage divider module 201 are relatively weak and have no drive capability, the voltage follower module 202 can enhance the electrical signal of the first bus and the electrical signal of the second bus, for example, increase a current of the electrical signal of the first bus and a current of the electrical signal of the second bus.

Optionally, referring to FIG. 5, the voltage follower module 202 includes two voltage followers 2022 (for example, the voltage follower may be LM2904), each voltage follower 2022 corresponds to one bus, the voltage follower 2022 includes a first input end, a second input end, and an output end, and the output end is connected to the second input end and the forward bias module 203.

The forward bias module 203 is configured to forward bias the voltage of the first bus and the voltage of the second bus.

When the serial bus is the RS485 bus or the RS422 bus, the first bus and the second bus are differential levels and have a common-mode voltage, and a maximum common-mode voltage range is from −7 V to +12 V. When the serial bus is the RS232 bus, the voltages of the first bus and the second bus both use a ground cable (GND) as a reference, and a voltage range of the bus is from −15 V to +15 V. Therefore, a voltage range of the first bus and a voltage range of the second bus are relatively wide, and the forward bias module 203 may forward bias the voltage of the first bus and the voltage of the second bus, so that a voltage detected by the control module 203 does not exceed a detection threshold.

Optionally, referring to FIG. 5, the forward bias module 203 includes two forward bias units, each forward bias unit corresponds to one bus, and the forward bias unit includes a third resistor 2031 and a fourth resistor 2032, where a first end of the third resistor 2031 is connected to the voltage follower module 202, a second end of the third resistor 2031 is connected to a first end of the fourth resistor 2032 and the control module 204, and a second end of the fourth resistor 2032 is connected to a reference voltage. For example, the reference voltage may be 2.5 V.

The control module 204 is configured to: measure a first digital voltage of the first bus and a second digital voltage of the second bus, and determine a wire fault type of the serial bus based on the first digital voltage, the second digital voltage, and an electrical standard for the serial bus.

The control module 204 may have an analog-to-digital conversion function and a control function. For example, the control module 204 may be a micro control unit (Micro Control Unit, MCU). The analog-to-digital conversion function may be used to separately convert an analog voltage of the first bus and an analog voltage of the second bus into a digital voltage, and the control function may refer to that the MCU controls a level change of a bus while collecting actual voltage data of the bus. For example, the control module 204 includes an analog-to-digital conversion interface ADC1 for implementing the voltage of the first bus and an analog-to-digital conversion interface ADC2 for implementing the voltage of the second bus.

Because specific function implementation of the control module 204 is different when different buses are used as the serial bus, and electrical standards for and working principles of different buses are different, the following provides detailed descriptions by using examples in which the serial bus is the RS485 (or RS422) bus and the RS232 bus.

(1) When the serial bus is the RS485 bus or the RS422 bus, the control module 204 may measure the digital voltage of the first bus relative to the ground cable and the digital voltage of the second bus relative to the ground cable, determine a differential digital voltage of the serial bus based on the digital voltage of the first bus and the digital voltage of the second bus, and determine the wire fault type of the serial bus based on the differential digital voltage and the electrical standard for the serial bus.

The measuring, by the control module 204, the digital voltage of the first bus relative to the ground cable and the digital voltage of the second bus relative to the ground cable may include: when the serial bus is in an idle state, measuring the digital voltage of the first bus and the digital voltage of the second bus; when the serial bus outputs a logical high level (that is, outputs a logical level 1), measuring the digital voltage of the first bus and the digital voltage of the second bus; and when the serial bus outputs a logical low level (that is, outputs a logical level 0), measuring the digital voltage of the first bus and the digital voltage of the second bus.

In addition, the electrical standard for the RS485 bus or the RS422 bus may include: when a differential digital voltage is greater than 200 mV (0.2 V) and a maximum differential digital voltage does not exceed 6 V, it indicates that the serial bus outputs a logical high level; and when the differential digital voltage is less than 200 mV and a minimum differential digital voltage does not exceed −6 V, it indicates that the serial bus outputs a logical low level. A maximum common-mode voltage from −7 V to +12 V exists between the first bus and the second bus.

The control module 204 may determine the wire fault type of the serial bus based on differential digital voltages obtained in different states and the electrical standard for the serial bus. Specifically, when the RS485 bus or the RS422 bus connecting the primary device to the secondary device has no transparent data transmission and valid data cannot be obtained, the apparatus may detect a bus voltage when the serial bus is in an idle state, detect bus voltages when the serial bus outputs logical level 0 and logical level 1, and determine a specific wire fault type based on a detection result and the electrical standard for the serial bus.

For example, when the serial bus is in an idle state and a common-mode voltage of the serial bus obtained by the control module 204 is less than −7 V or is greater than 12 V, because the common-mode voltage does not belong to a common-mode voltage range from −7 V to +12 V in the electrical standard for the RS485 bus or the RS422 bus, it may be determined that the wire fault type of the serial bus is cable bonding. For example, a cable of another interface is bonded with the first bus or the second bus. When the serial bus is in an idle state and the differential digital voltage obtained by the control module 204 belongs to [−3.3 V, −0.2 V], it may be determined that the wire fault type of the serial bus is a reversed cable connection. For example, the first bus is connected to an interface of the second bus and the second bus is connected to an interface of the first bus. When the serial bus is in an idle state and the differential digital voltage obtained by the control module 204 is less than −3.3 V or is greater than 3.3 V, it may be determined that the wire fault type of the serial bus is that a cable is incorrectly connected to a port. For example, a cable of the first bus and/or the second bus is connected to another interface. When the serial bus is in an idle state, the serial bus outputs a logical high level, and the serial bus outputs a logical low level, if each differential digital voltage obtained by the control module 204 is 0, it may be determined that the wire fault type of the serial bus is a short circuit. That is, the first bus and the second bus are short-circuited. When the serial bus is in an idle state and the differential digital voltage obtained by the control module 204 belongs to (−0.2 V, 0.2 V), the serial bus outputs a logical high level and the differential digital voltage obtained by the control module 204 belongs to [−0.2 V, 6 V), or the serial bus outputs a logical low level and the differential digital voltage obtained by the control module 204 belongs to [−6 V, 0.2 V), it may be determined that the wire fault type of the serial bus is that a cable is incorrectly connected to a port. When the serial bus is in an idle state and the differential digital voltage obtained by the control module 204 belongs to (−0.2 V, 0.2 V), the serial bus outputs a logical high level and the differential digital voltage obtained by the control module 204 belongs to [−6 V, −0.2 V), and the serial bus outputs a logical low level and the differential digital voltage obtained by the control module 204 belongs to (0.2 V, 6 V], it may be determined that the wire fault type of the serial bus is that a cable is improperly installed.

A relationship between the different wire fault types and the differential digital voltages may be briefly shown in the following Table 1. X in Table 1 may indicate that when the serial bus is in this state, a determined result of the wire fault type does not depend on a measured bus voltage.

TABLE 1

| Idle state Bus voltage | When logical 1 is sent Bus voltage | When logical 0 is sent Bus voltage | Fault type |
| --- | --- | --- | --- |
| Common-mode voltage <−7 or >12 | X | X | Cable bonding |
| [−3.3, −0.2] | X | X | Reversed cable connection |
| <−3.3 or >3.3 | X | X | Cable is incorrectly connected to a port |
| 0 | 0 | 0 | Signal cables A and B are short-circuited |
| (−0.2, 0.2) | [−0.2, 6] | X | Cable is incorrectly connected to a port |
| (−0.2, 0.2) | X | [−6, 0.2] | Cable is incorrectly connected to a port |
| (−0.2, 0.2) | [−6, −0.2) | (0.2, 6] | Cable is improperly installed |

It should be noted that as the RS485 bus or the RS422 bus are widely applied, a specific wire fault type needs to be determined with reference to a specific RS485/RS422 circuit design, a total quantity of nodes on a bus, and a possible incorrect connection in a real scenario. Therefore, a determining method depends on a hardware design and an on-site scenario. Table 1 lists only relatively typical solutions of determining the wire fault type, and constitutes no limitation on this embodiment of this application.

Optionally, to more precisely detect a bus voltage of the RS485 bus or the RS422 bus, a Baud rate of the RS485 bus or the RS422 bus may be reduced to 1200 or even lower, or an MCU pin for controlling an RS485/RS422 chip is directly configured to be in an I/O mode. The MCU controls a level change of the RS485/RS422 bus, to detect a bus voltage, and the wire fault type is determined based on a change of the bus voltage.

(2) When the serial bus is the RS232 bus, the control module 204 may measure the digital voltage of the first bus (that is, an RX bus) relative to a ground cable and the digital voltage of the second bus (that is, a TX bus) relative to the ground cable, and determine the wire fault type of the serial bus based on the digital voltage of the first bus, the digital voltage of the second bus, and the electrical standard for the serial bus.

The measuring, by the control module 204, the digital voltage of the TX bus relative to the ground cable may include: when the TX bus outputs a logical high level, measuring the digital voltage of the TX bus; and when the TX bus outputs a logical low level, measuring the digital voltage of the TX bus.

In addition, the electrical standard for the RS232 bus may include: when the digital voltage of the RX bus relative to the ground cable and the digital voltage of the TX bus relative to the ground cable belong to [−15, −3], it indicates that a logical high level is output; and when the digital voltage of the RX bus relative to the ground cable and the digital voltage of the TX bus relative to the ground cable belong to [3, 15], it indicates that a logical low level is output. For example, an RS232 chip of the secondary device is MAX3232EIDBR (TI company). When an input of the chip is a logical low level, a typical level value of 5.4 V is output, and when an input of the chip is a logical high level, a typical level value of −5.4 V is output.

The control module 204 may determine the wire fault type of the serial bus based on digital voltages obtained in different states and the electrical standard for the serial bus. Specifically, when the RS232 bus connecting the primary device to the secondary device has no transparent data transmission and valid data cannot be obtained, the apparatus may detect a bus voltage of the RX bus, detect digital voltages when the TX bus outputs logical 0 and logical 1, and determine a specific wire fault type based on a detection result and the electrical standard for the serial bus.

For example, when the digital voltage of the RX bus is 0 V, a corresponding digital voltage belongs to [−6.5 V, −4.5 V] when the TX bus outputs logical 1, and a corresponding digital voltage belongs to [−6.5 V, 4.5 V] when the TX bus outputs logical 0, it may be determined that the wire fault type of the serial bus is a line order error, and specifically, the RX bus and the TX bus are reversely connected. When the bus voltage of the RX bus is less than −6.5 V, a corresponding digital voltage belongs to [−6.5 V, −4.5 V] when the TX bus outputs logical 1, and a corresponding digital voltage belongs to [4.5 V, 6.5 V] when the TX bus outputs logical 0, it may be determined that the wire fault type of the serial bus is a line order error, and specifically, the TX bus and the GND cable are reversely connected. When the digital voltage of the RX bus belongs to [4.5 V, 6.5 VI, a corresponding digital voltage belongs to [−6.5 V, −4.5 V] when the TX bus outputs logical 1, and a corresponding digital voltage belongs to [4.5 V, 6.5 V] when the TX bus outputs logical 0, it may be determined that the wire fault type of the serial bus is a line order error, and specifically, the RX bus and the GND cable are reversely connected. When the digital voltage of the RX bus is greater than −3 V or is less than −15 V, a corresponding digital voltage belongs to [−6.5 V, −4.5 V] when the TX bus outputs logical 1, and a corresponding digital voltage belongs to [4.5 V, 6.5 V] when the TX bus outputs logical 0, it may be determined that the RX bus is bonded with another cable. When the digital voltage of the RX bus belongs to [−15V, −3V], and a corresponding digital voltage is greater than 6.5 V or is less than −6.5 V when the TX bus outputs logical 1, it may be determined that the TX bus is bonded with another cable. When the digital voltage of the RX bus belongs to [−15, −3], and a corresponding digital voltage is greater than 6.5 V or is less than −6.5 V when the TX bus outputs logical 0, it may be determined that the TX bus is bonded with another cable. When the digital voltage of the RX bus is 0, a corresponding digital voltage belongs to [−6.5 V, −4.5 V] when the TX bus outputs logical 1, and a corresponding digital voltage belongs to 14.5 V, 6.5 V] when the TX bus outputs logical 0, it may be determined that a cable is improperly installed.

A relationship between the different wire fault types and the different digital voltages of the buses may be briefly shown in the following Table 2. In Table 2. RX indicates an RX bus, TX indicates a TX bus, and X may indicate that when the bus is in this state, a determined result of the wire fault type does not depend on a measured digital voltage.

TABLE 2

| RX digital voltage (V) | When TX sends logical 0 TX digital voltage (V) | When TX sends logical 1 TX digital voltage (V) | Fault type |
|---|---|---|---|
| 0 | [−6.5, −4.5] | [−6.5, 4.5] | Line order error, where TX and RX are reversely connected |
| <−6.5 | [−6.5, −4.5] | [4.5, 6.5] | Line order error, where TX and GND are reversely connected |
| [4.5, 6.5] | [−6.5, −4.5] | [4.5, 6.5] | Line order error, where RX and GND are reversely connected |
| >−3 or <−15 | [−6.5, −4.5] | [4.5, 6.5] | RX is bonded with another cable |
| [−15, −3] | >6.5 or <−6.5 | X | TX is bonded with another cable |
| [−15, −3] | X | >6.5 or <−6.5 | TX is bonded with another cable |
| 0 | [−6.5, −4.5] | [4.5, 6.5] | Cable is improperly installed |

It should be noted that as the RS232 bus is widely applied, a specific wire fault type needs to be determined with reference to a specific RS232 circuit design, a total quantity of nodes on a bus, and a possible incorrect connection in a real scenario. Therefore, a determining method depends on a hardware design and an on-site scenario. Table 2 lists only relatively typical solutions of determining the wire fault type, and constitutes no limitation on this embodiment of this application.

Optionally, to more precisely detect a voltage of the RS232 bus, a Baud rate of the RS232 bus may be reduced to 1200 or even lower, or an MCU pin for controlling an RS232 chip is directly configured to be in an I/O output mode. The MCU controls a level change of the RS232 bus, to detect a bus voltage, and the wire fault type is determined based on a change of the bus voltage.

According to the detection apparatus provided in this embodiment of this application, the voltage divider module reduces the voltage of the first bus and the voltage of the second bus, to prevent the detection apparatus from interfering communication using the serial bus. In addition, the voltage follower module and the forward bias module respectively enhance the electrical signals of the buses and forward bias the voltages of buses, so that when the control module measures a digital voltage of the serial bus in different states of the serial bus, measurement accuracy can be ensured. Therefore, when the wire fault type of the serial bus is determined based on the measured digital voltage and the electrical standard for the serial bus, a fault can be quickly located and a cause can be quickly found, thereby improving a detection rate and accuracy.

Figure 6:
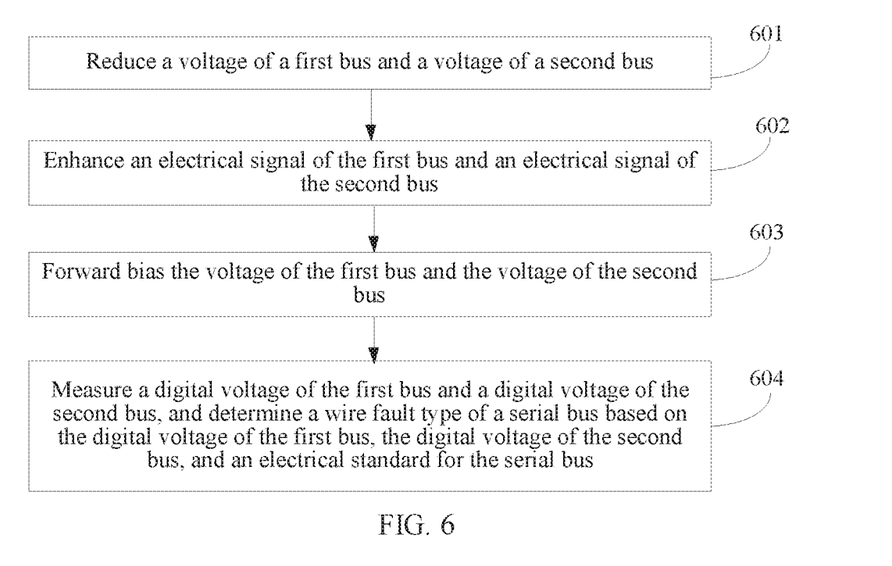
FIG. 6 is a schematic flowchart of a detection method according to an embodiment of this application.

FIG. 6 is a method flowchart of a detection method according to an embodiment of this application. The method is applied to a detection apparatus, the apparatus is connected to a serial bus, the serial bus is disposed between a primary device and a secondary device, the serial bus includes a first bus and a second bus, and the method includes the following several steps:

Step 601: Reduce a voltage of the first bus and a voltage of the second bus.

Step 602: Enhance an electrical signal of the first bus and an electrical signal of the second bus.

Step 603: Forward bias the voltage of the first bus and the voltage of the second bus.

Step 604: Measure a digital voltage of the first bus and a digital voltage of the second bus, and determine a wire fault type of the serial bus based on the digital voltage of the first bus, the digital voltage of the second bus, and an electrical standard for the serial bus.

It should be noted that for specific descriptions of step 601 to step 604, correspondingly refer to related descriptions of the voltage divider module 201, the voltage follower module 202, the forward bias module 203, and the control module 204 in the foregoing embodiment, and details are not described again in this embodiment of this application.

In a possible implementation, the first bus is a positive electrode bus, the second bus is a negative electrode bus, and the determining a wire fault type of the serial bus based on the digital voltage of the first bus, the digital voltage of the second bus, and an electrical standard for the serial bus includes: determining a differential digital voltage of the serial bus based on the digital voltage of the first bus and the digital voltage of the second bus; and determining the wire fault type of the serial bus based on the differential digital voltage and the electrical standard for the serial bus. For example, the serial bus may be an RS485 bus or an RS422 bus.

Optionally, when the first bus is a positive electrode bus and the second bus is a negative electrode bus, the first bus may be pulled up to a preset voltage and the second bus may be pulled down to a ground cable. For example, the preset voltage is 3.3 V, the first bus is pulled up to 3.3 V by using a pull-up resistor Rup, and the second bus is pulled down to GND by using a pull-down resistor Rdn.

Correspondingly, the measuring a digital voltage of the first bus and a digital voltage of the second bus includes: when the serial bus is in an idle state, measuring the digital voltage of the first bus and the digital voltage of the second bus; when the serial bus outputs a logical high level, measuring the digital voltage of the first bus and the digital voltage of the second bus; and when the serial bus outputs a logical low level measuring the digital voltage of the first bus and the digital voltage of the second bus.

In a possible implementation, the first bus is a receive (RX) bus, the second bus is a transmit (TX) bus, and a ground cable of the primary device is connected to a ground cable of the secondary device. Correspondingly, the measuring a digital voltage of the first bus and a digital voltage of the second bus includes: measuring the digital voltage of the first bus; when the second bus outputs a logical high level, measuring the digital voltage of the second bus; and when the second bus outputs a logical low level, measuring the digital voltage of the second bus.

According to the detection method provided in this embodiment of this application, the voltage of the first bus and the voltage of the second bus are reduced, to prevent the detection apparatus from interfering communication using the serial bus. In addition, the electrical signals of the buses are enhanced and the voltages of the buses are forward biased, so that when a digital voltage of the serial bus is measured in different states of the serial bus, measurement accuracy can be ensured. Therefore, when the wire fault type of the serial bus is determined based on the measured digital voltage and the electrical standard for the serial bus, a fault can be quickly located and a cause can be quickly found, thereby improving a detection rate and accuracy.

In conclusion, the foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

The invention claimed is:

1. A detection apparatus, wherein the apparatus is connected to a serial bus of a Serial Interface (RS) type, the serial bus is disposed between a primary device and a secondary device, the serial bus comprises a first bus and a second bus, and the apparatus comprises a voltage divider module, a voltage follower module, a forward bias module, and a control module that are sequentially connected, wherein
the voltage divider module is configured to reduce a voltage of the first bus and a voltage of the second bus;
the voltage follower module is configured to enhance an electrical signal of the first bus and an electrical signal of the second bus;
the forward bias module is configured to forward bias the voltage of the first bus and the voltage of the second bus; and
the control module is configured to: measure a digital voltage of the first bus and a digital voltage of the second bus, and determine, from a plurality of types of wire faults, a wire fault type of the serial bus based on the digital voltage of the first bus, the digital voltage of the second bus, and an electrical standard for the serial bus.

2. The apparatus according to claim 1, wherein the first bus is a positive electrode bus, the second bus is a negative electrode bus, and the control module is further configured to:
determine a differential digital voltage of the serial bus based on the digital voltage of the first bus and the digital voltage of the second bus; and
determine the wire fault type of the serial bus based on the differential digital voltage and the electrical standard for the serial bus.

3. The apparatus according to claim 2, wherein the first bus is further connected to a preset voltage, and the second bus is further connected to a ground cable.

4. The apparatus according to claim 3, wherein the control module is configured to:
when the serial bus is in an idle state, measure the digital voltage of the first bus and the digital voltage of the second bus;
when the serial bus outputs a logical high level, measure the digital voltage of the first bus and the digital voltage of the second bus; and
when the serial bus outputs a logical low level, measure the digital voltage of the first bus and the digital voltage of the second bus.

5. The apparatus according to claim 1, wherein the first bus is a receive, RX bus, the second bus is a transmit, TX bus, and a ground cable of the primary device is connected to a ground cable of the secondary device.

6. The apparatus according to claim 5, wherein the control module is configured to:
measure the digital voltage of the first bus;
when the second bus outputs a logical high level, measure the digital voltage of the second bus; and
when the second bus outputs a logical low level, measure the digital voltage of the second bus.

7. The apparatus according to claim 6, wherein the voltage divider module comprises two voltage division units, each voltage division unit corresponds to one bus, and the voltage division unit comprises a first resistor, a second resistor, and a capacitor, wherein
a first end of the first resistor is connected to the bus, a second end of the first resistor is connected to a first end of the second resistor, a first end of the capacitor, and the voltage follower module, and a second end of the second resistor and a second end of the capacitor are connected to a ground cable.

8. The apparatus according to claim 7, wherein the voltage follower module comprises two voltage followers, each voltage follower corresponds to one bus, the voltage follower comprises a first input end, a second input end, and an output end, and the output end is connected to the second input end and the forward bias module.

9. The apparatus according to claim 8, wherein the forward bias module comprises two forward bias units, each forward bias unit corresponds to one bus, and the forward bias unit comprises a third resistor and a fourth resistor, wherein
a first end of the third resistor is connected to the voltage follower module, a second end of the third resistor is connected to a first end of the fourth resistor and the control module, and a second end of the fourth resistor is connected to a reference voltage.

10. The apparatus according to claim 1, wherein the plurality of types of wire faults include: a short circuit, an open circuit, a reversed connection, a line order error, cable bonding, improper installation of a cable, and/or connection miss.

11. A detection method, applied to a detection apparatus, wherein the apparatus is connected to a serial bus of a Serial Interface (RS) type, the serial bus is disposed between a primary device and a secondary device, the serial bus comprises a first bus and a second bus, and the method comprises:
reducing a voltage of the first bus and a voltage of the second bus;
enhancing an electrical signal of the first bus and an electrical signal of the second bus;
forward biasing the voltage of the first bus and the voltage of the second bus; and
measuring a digital voltage of the first bus and a digital voltage of the second bus, and determining, from a plurality of types of wire faults, a wire fault type of the serial bus based on the digital voltage of the first bus, the digital voltage of the second bus, and an electrical standard for the serial bus.

12. The method according to claim 11, wherein the first bus is a positive electrode bus, the second bus is a negative electrode bus, and the determining a wire fault type of the serial bus based on the digital voltage of the first bus, the digital voltage of the second bus, and an electrical standard for the serial bus comprises:

determining a differential digital voltage of the serial bus based on the digital voltage of the first bus and the digital voltage of the second bus; and determining the wire fault type of the serial bus based on the differential digital voltage and the electrical standard for the serial bus.

13. The method according to claim 11, wherein the first bus is pulled up to a preset voltage, and the second bus is pulled down to a ground cable.

14. The method according to claim 13, wherein the measuring a digital voltage of the first bus and a digital voltage of the second bus comprises:

when the serial bus is in an idle state, measuring the digital voltage of the first bus and the digital voltage of the second bus;

when the serial bus outputs a logical high level, measuring the digital voltage of the first bus and the digital voltage of the second bus; and when the serial bus outputs a logical low level, measuring the digital voltage of the first bus and the digital voltage of the second bus.

15. The method according to claim 11, wherein the first bus is a receive (RX) bus, the second bus is a transmit (TX) bus, and a ground cable of the primary device is connected to a ground cable of the secondary device.

16. The method according to claim 15, wherein the measuring a digital voltage of the first bus and a digital voltage of the second bus comprises:

measuring the digital voltage of the first bus;

when the second bus outputs a logical high level, measuring the digital voltage of the second bus; and when the second bus outputs a logical low level, measuring the digital voltage of the second bus.

17. The method according to claim 11, wherein the plurality of types of wire faults include: a short circuit, an open circuit, a reversed connection, a line order error, cable bonding, improper installation of a cable, and/or connection miss.

* * * * *